US008451618B2

(12) United States Patent
Boeck et al.

(10) Patent No.: US 8,451,618 B2
(45) Date of Patent: May 28, 2013

(54) INTEGRATED ANTENNAS IN WAFER LEVEL PACKAGE

(75) Inventors: Josef Boeck, Munich (DE); Rudolf Lachner, Ingolstadt (DE); Maciej Wojnowski, Munich (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/914,274

(22) Filed: Oct. 28, 2010

(65) Prior Publication Data
US 2012/0104574 A1 May 3, 2012

(51) Int. Cl.
*H05K 1/18* (2006.01)

(52) U.S. Cl.
USPC ............ 361/764; 361/761; 361/765; 361/766

(58) Field of Classification Search
USPC .................. 361/760–766, 782–784, 795, 803
See application file for complete search history.

(56) References Cited

U.S. PATENT DOCUMENTS

| | | | |
|---|---|---|---|
| 6,323,735 B1 * | 11/2001 | Welland et al. ............. | 331/36 L |
| 6,770,955 B1 | 8/2004 | Coccioli et al. | |
| 6,914,566 B2 * | 7/2005 | Beard ............................ | 343/702 |
| 7,049,682 B1 | 5/2006 | Mathews et al. | |
| 7,098,077 B2 | 8/2006 | Huang et al. | |
| 7,119,745 B2 | 10/2006 | Gaucher et al. | |
| 7,369,090 B1 * | 5/2008 | Beard ........................... | 343/702 |
| 2004/0232543 A1 | 11/2004 | Goller et al. | |
| 2005/0122265 A1 | 6/2005 | Gaucher et al. | |
| 2006/0033664 A1 | 2/2006 | Soler Castany et al. | |
| 2006/0276157 A1 | 12/2006 | Chen et al. | |
| 2007/0026567 A1 | 2/2007 | Beer et al. | |
| 2007/0029667 A1 | 2/2007 | Fujii et al. | |
| 2007/0164420 A1 | 7/2007 | Chen et al. | |
| 2007/0170560 A1 | 7/2007 | Gaucher et al. | |
| 2007/0194427 A1 | 8/2007 | Choi et al. | |
| 2007/0200748 A1 | 8/2007 | Hoegerl et al. | |

(Continued)

FOREIGN PATENT DOCUMENTS

| | | |
|---|---|---|
| DE | 102005015109 A1 | 10/2006 |
| DE | 102006001767 A1 | 7/2007 |

(Continued)

OTHER PUBLICATIONS

U.S. Appl. No. 12/914,274, filed Oct. 28, 2010.

(Continued)

*Primary Examiner* — Tuan T Dinh
(74) *Attorney, Agent, or Firm* — Eschweiler & Associates, LLC

(57) ABSTRACT

A semiconductor module having one or more integrated antennas in a single package is provided herein to comprise a bonding interconnect structure having a plurality of individual bonding elements that are confined to a relatively small area of the bottom of a package. In particular, the semiconductor module comprises a bonding interconnect structure configured to connect an integrated package to a printed circuit board (PCB), wherein the integrated antenna structures are located at greater center-to-center distance from the IC device than the three dimensional interconnect structures. Therefore, the bonding interconnect structures are confined to a connection area that causes a part of the package containing the one or more antenna structures to extend beyond the bonding interconnect structure as a cantilevered structure. Such a bonding interconnect structure result in a package that is in contact with a PCB at a relatively small area that supports the load of the package.

12 Claims, 11 Drawing Sheets

U.S. PATENT DOCUMENTS

| | | |
|---|---|---|
| 2008/0029886 A1 | 2/2008 | Cotte et al. |
| 2008/0105966 A1 | 5/2008 | Beer et al. |
| 2009/0184882 A1* | 7/2009 | Jow .................... 343/873 |
| 2010/0193935 A1 | 8/2010 | Lachner et al. |
| 2010/0219513 A1 | 9/2010 | Zhang et al. |

FOREIGN PATENT DOCUMENTS

| | | |
|---|---|---|
| DE | 102008038175 A1 | 2/2010 |
| DE | 102010001407 A1 | 9/2010 |
| JP | 2008259250 A | 10/2008 |
| KR | 1020050084978 | 5/2006 |
| WO | 2008111914 A1 | 9/2008 |

OTHER PUBLICATIONS

U.S. Appl. No. 12/645,969, filed Dec. 23, 2009. 20 Pages.

Office Action dated Oct. 31, 2011 in connection with U.S. Appl. No. 12/645,969.

Notice of Allowance dated Jun. 6, 2012 for U.S. Appl. No. 12/645,969 (9 pages).

Office Action dated Oct. 24, 2012 for U.S. Appl. No. 13/622,058.

Notice of allowance dated Feb. 14, 2013 for U.S. Appl. No. 13/622,058.

* cited by examiner

INTEGRATED ANTENNAS IN WAFER LEVEL PACKAGE

FIELD

The present disclosure relates generally to methods and systems related to radio frequency (RF) communication devices.

BACKGROUND

In millimeter wave radar systems (e.g., as for automotive safety and comfort applications) antenna structures are placed on high frequency substrates or high frequency printed circuit boards (HF PCBs), increasing the overall cost of design due to the extra high expense of such high frequency substrates. Antennas such as microstrip antennas (e.g., patch antennas) are often built on these special high frequency substrates. HF PCBs are often constructively based on Rogers, Taconic or other PTFE materials.

Millimeter wave output power can be generated on a semiconductor monolithic microwave integrated circuit (MMIC), which may be located also on the HF PCB. MMIC devices typically perform functions such as microwave mixing, power amplification, low noise amplification, and high frequency switching. The inputs and outputs on MMIC devices frequently match to a characteristic impedance (e.g., 50 ohms) and interconnect to an antenna. These interconnections between MMIC devices and an antenna generally involve a lossy chip/board interface (e.g., bond wires).

Whenever a source of power, such as MMIC devices, delivers power to a load, the power is delivered most efficiently when the impedance of the load is equal to or matches the complex conjugate of the impedance of the source (impedance matching). For two impedances to be complex conjugates, their resistances are equal, and their reactance are equal in magnitude but of opposite signs. Such impedance matching between antennas and chip output can suffer from large manufacturing tolerances of the bonding process and on printed circuit board (PCB) wiring.

Because of a large demand for efficient, less expensive, and cost-effective radar sensing, suppliers face the challenge of delivering antenna packages with maximum potential range, data rate and power integrated in the same radar system.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

A semiconductor module having integrated electronics (e.g., including antennas) in a single package is provided herein to comprise a bonding interconnect structure having a plurality of individual bonding elements that are confined to a relatively small area of the bottom of a package. In particular, the semiconductor module may comprise a bonding interconnect structure configured to connect an integrated package, having an IC and one or more integrated antenna structures, to a printed circuit board (PCB), wherein the integrated antenna structures are located at greater center-to-center distance from the IC device than the three dimensional interconnect structures. Therefore, the bonding interconnect structures are confined to a connection area (e.g., that is <30% than the area of the bottom surface of a package) that causes a part of the package containing the one or more antenna structures to extend beyond the bonding interconnect structure. Such a bonding interconnect structure result in a package that is in contact with a PCB at a relatively small area (i.e., a connection area) and that supports the load of the package.

The following description and annexed drawings set forth in detail certain illustrative aspects and implementations of the invention. These are indicative of only a few of the various ways in which the principles of the invention may be employed.

DETAILED DESCRIPTION

Figure 1A:
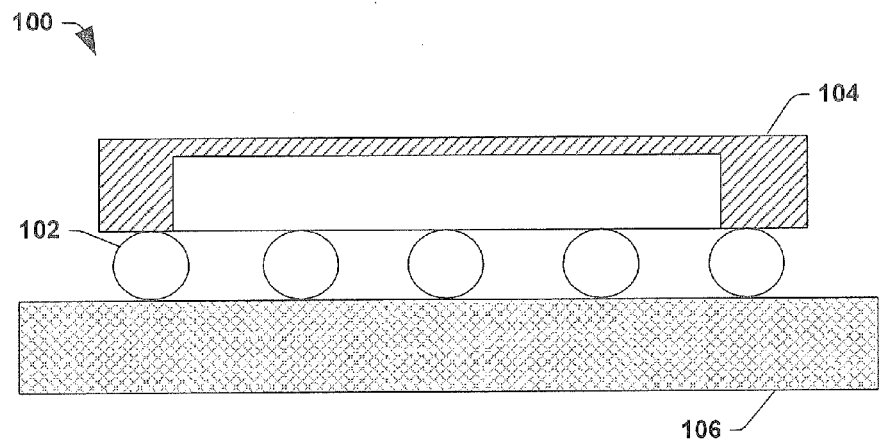
FIGS. 1a-1b illustrate a semiconductor module at room temperature and at an elevated temperature.

One or more implementations of the present invention will now be described with reference to the attached drawings, wherein like reference numerals are used to refer to like elements throughout.

Integrated wafer packages can be integrated with antenna structures that are coupled to an integrated circuit (IC) chip through a feed structure that is directly connected to the chip and without a bonding interface structure that is external to bond pad connections of the IC device. For example, at least one antenna can be integrated with the chip through an interface layer comprising a metallization layer (e.g., redistribution layer) coupled to a package molding compound with the chip embedded therein. The interface layer integrates the antenna components directly within the same package and can further comprise three dimensional interconnect structures (e.g., solder balls) configured to connect the chip externally. Expensive high frequency substrates and lossy interfaces are thereby eliminated for integrated antennas comprised within a package in high frequency applications (e.g., millimeter wave radar sensing).

Figure 1B:
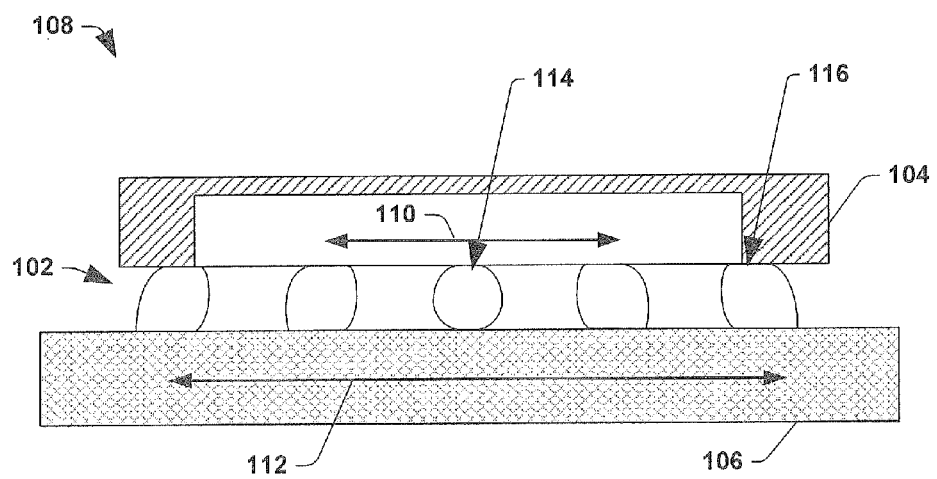

However, the inventors have appreciated that a semiconductor module's package and printed circuit board (PCB) may have different thermal expansion coefficients, which may lead to mechanical stress between the package and PCB during temperature changes. For example, FIG. 1a illustrates a semiconductor module 100 comprising bonding interconnect structures (e.g., solder balls) 102 disposed between a package 104 and a PCB 106 at room temperature. FIG. 1b illustrates a semiconductor module 108 comprising bonding interconnect structures 102 disposed between a package 104 and a PCB 106 at an elevated temperature. At the elevated temperature (FIG. 1b), the package 104 and PCB 106 respectively undergo thermal expansions. As shown in FIG. 1b, package 104 will undergo a thermal expansion (represented by line 110) that is different (e.g., smaller) than the thermal expansion (represented by line 112) of PCB 106. The difference in thermal expansions causes a mechanical stress on the interconnect structures (e.g., solder balls) located between the package 104 and the PCB 106 (e.g., the mechanical stress on solder ball 114 is less than the mechanical stress on solder ball 116).

During typical reliability testing semiconductor modules may undergo extensive temperature cycling (e.g., from −40° C. to +125° C.). Over thousands of temperature cycles, the mechanical stress may cause cracks or electrical shorts to form in the interconnect structures. Therefore, typically the area of a package in which integrated antennas may be formed is limited by reliability concerns since the reliability of large packages (e.g., greater than 10 mm) may not be guaranteed.

The inventors have also appreciated that since the mechanical stress on the bonding interconnect structures (e.g., solder balls) increases as a function of the distance between the bonding interconnect structures that mechanical stress may be decreased by placing bonding interconnect structures close together (e.g., because the amount of material located between the solder balls is reduced thereby reducing the amount of thermal expansion between the solder balls).

Therefore, the semiconductor module provided herein may comprise a bonding interconnect structure having a plurality of individual bonding elements that are confined to a relatively small area of the bottom of a package and that supports the load of the package. In particular, the semiconductor module may comprise a bonding interconnect structure configured to connect an integrated package, having an IC and one or more integrated antenna structures, to a printed circuit board (PCB), wherein the integrated antenna structures are located at greater center-to-center distance from the IC device than the 3D interconnect structures. Therefore, the bonding interconnect structures are confined to a connection area (e.g., that is <30% than the area of the bottom surface of a package) that causes the one or more antenna structures to extend radially outward from the IC beyond the bonding interconnect structure. In one embodiment, placement of bonding interconnect structures in the vicinity of an IC device allows for at least a part of the package containing an integrated antenna to extend outward from the IC device beyond the bonding interconnect structure as part of a cantilevered structure.

Figure 2A:
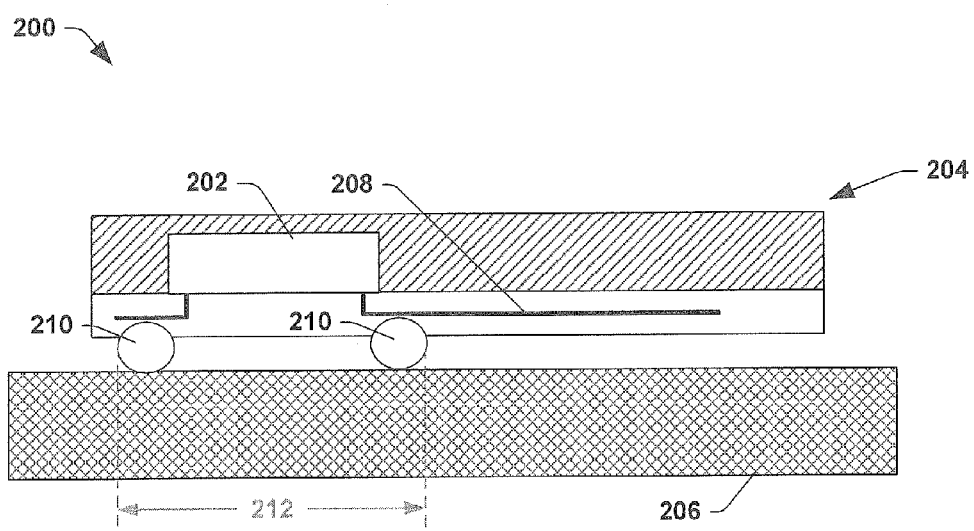
FIG. 2a illustrates a cross-sectional view of one embodiment of a semiconductor module comprising one or more antenna structures extending beyond the bonding interconnect structure.

FIG. 2a illustrates a cross-sectional view of a first embodiment of a semiconductor module 200 comprising one or more integrated antenna structures 208 extending outward from IC 202 beyond the bonding interconnect structure 210 (i.e., having one or more integrated antennas configured at a greater center-to-center distance from the IC device than any individual bonding elements of the bonding interconnect structure). The bonding interconnect structure 210 is configured to physically connect to a package 204 at connection area (defined by area 212) that is a subset of the area of the bottom of the package. For example, the solder balls may be separated by 3 mm center-to-center distance along an x-axis to support a package having a length of 9 mm along the x-axis. As shown in FIG. 2a, placement of the bonding interconnect structure 210 may form a cantilevered structure, wherein a portion of the package 204 containing an antenna 208 is mounted as a cantilevered structure (e.g., outside of the connection area) supported by the bonding interconnect structure 210 in the connection area 212. Therefore, the cantilevered structure, supported by the bonding interconnect structure, comprises at least part of one or more of the at least one integrated antenna structures.

Confining the bonding structures 210 to a connection area 212 (shown in FIG. 2a in two dimensions) between the package 204 and the PCB 206 reduces thermal mismatch between the package 204 and the PCB 206 by reducing the area comprised within the perimeter of the bonding structures (e.g., change in area due to thermal expansion, $\Delta A = \alpha^2 A_i \Delta T$, wherein $A_i$ is the initial area and $\alpha$ is the thermal expansion coefficient).

Figure 2B:
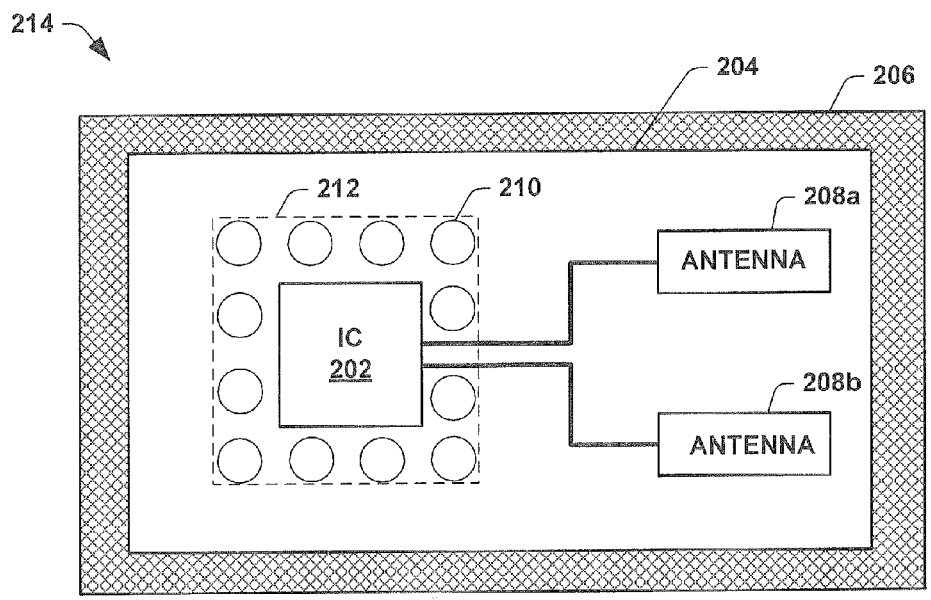
FIG. 2b illustrates an exemplary top view of one embodiment of a semiconductor module comprising one or more antenna structures extending beyond the bonding interconnect structure.

FIG. 2b illustrates an exemplary top view of a semiconductor module 214 comprising one or more antenna structures 208 extending beyond the bonding interconnect structure 210 (i.e., in a fan-out structure, wherein solder balls are located outside of the IC chip area). As shown in FIG. 2b, the connection area 212 is a subset of the area of the bottom surface of the package 204. In one embodiment, the connection area 212 comprises a bonding interconnect structure 210 having a plurality of solder balls and on the perimeter of the package 204, outside of the connection area 212, one or more antenna structures 208 are embedded within the package 204 (e.g., embedded within a package molding compound). In one embodiment, shown in FIG. 2c, at least one of the plurality of antenna structures 208a are configured from the IC device 202 at a center-to-center distance $d_1$ that is larger than the center-to-center distance $d_{2,x}$ between the IC device 202 and the bonding interconnect structure 210 (e.g., $d_1 > d_{2,1}$, $d_{2,2}$, $d_{2,3}$, etc.).

Figure 2C:
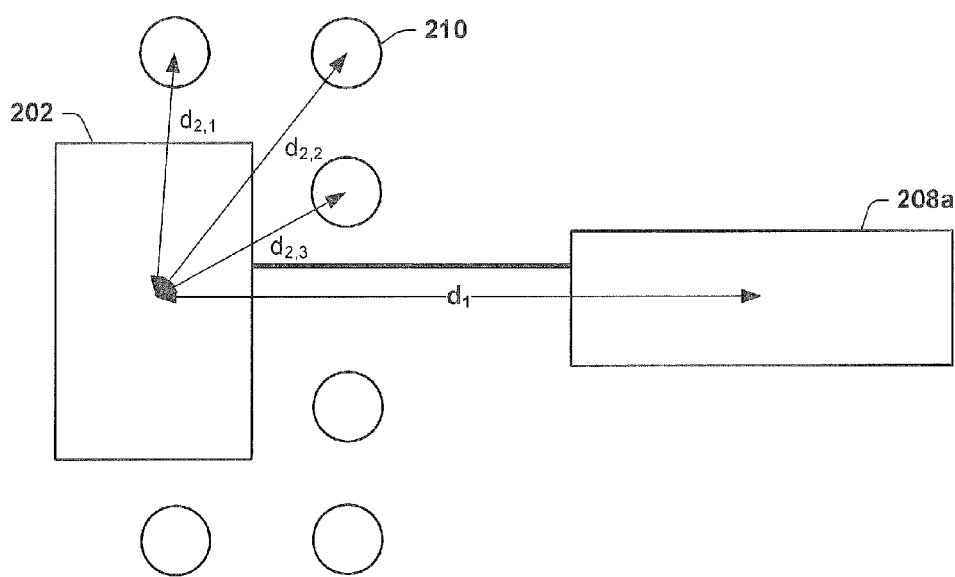
FIG. 2c illustrates a close up view of a section of the semiconductor module of FIG. 2b, showing the spacing between an IC and a bonding interface structure and an antenna, respectively.

Accordingly, as shown in FIGS. 2a-2c, placement of bonding interconnect structure 210 (e.g., solder balls) within a confined connection area 212 comprising a subset of the area of the bottom surface of a package (e.g., below a small portion of a package) allows for a larger package 204 to be coupled to a PCB 206. The larger package 204 may comprise larger antennas 208 for relatively low operating frequencies or may comprise a plurality of antennas 208 comprising an antenna array (e.g., for use in a beam forming array).

In various embodiments, the connection area may be located at different positions on the package. For example, in one non-limiting embodiment (e.g., shown in FIG. 2a) the connection area may be located at an edge of the package to form a cantilever structure (i.e., the package may extend significantly beyond the connection area in one direction). In another non-limiting embodiment (e.g., shown in FIG. 3a) the connection area may be located at the center of the package to form a double cantilever structure (i.e., the package may extend significantly beyond the connection area in two opposite directions). Additional embodiments, having different placements of the connection area, are also contemplated within the scope of the invention described herein.

FIGS. 3a-3e illustrate various embodiments of a semiconductor module having a package 304 comprising one or more integrated antenna structures 308 extending outward from an IC 302 beyond bonding interconnect structures 310 (i.e., having one or more integrated antennas configured at a greater center-to-center distance from the IC device than any individual bonding elements of the bonding interconnect structures). It will be appreciated that the embodiments of FIGS. 3a-3e are non-limiting exemplary embodiments intended to aid the reader in understanding. Accordingly, alternative designs of semiconductor modules having one or more embedded antennas 308 extending beyond bonding interconnect structures 310 are contemplated within the scope of the appended claims.

Figure 3A:
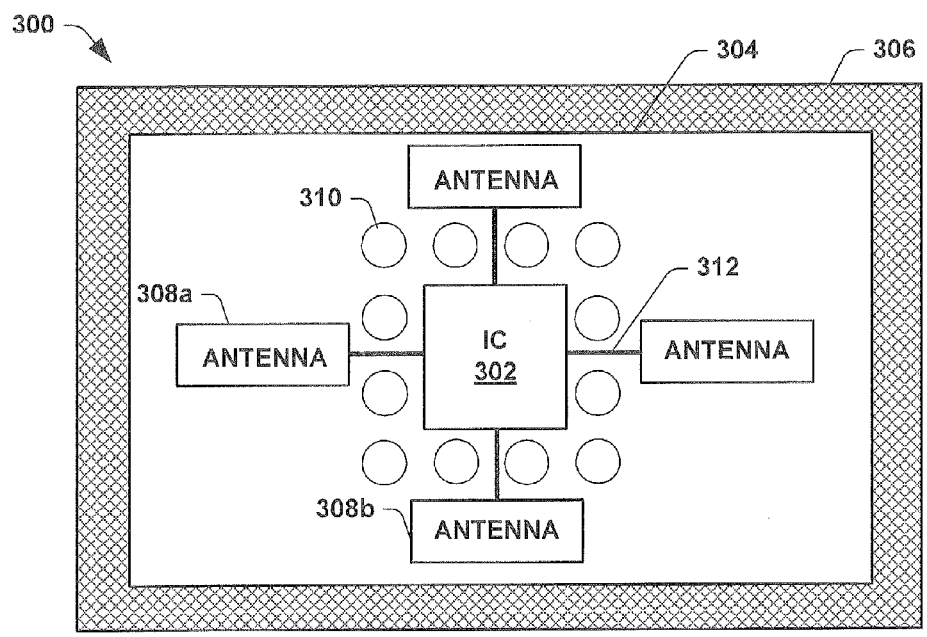
FIGS. 3a-3e illustrate various embodiments of top views of a semiconductor module having a portion of the package containing an antenna mounted as a cantilevered structure on a PCB.

FIG. 3a illustrates a semiconductor module 300 having a package 304 comprising one or more integrated antennas 308 that are arranged on different sides of an integrated chip 302. The antennas 308 may be coupled to the integrated chip 302 by way of a redistribution layer 312 that extends beyond the bonding interconnect structure 310. In one embodiment, the redistribution layer 312 allows for the antennas 308 to be displaced outside of the bonding structure 310 (i.e., radially outside of the bonding structure relative to the IC 302) thereby providing for a package that is large enough to allow for different antennas (e.g., antennas 308a and 308b) to be locally isolated. Local isolation of the antennas 308 can reduce crosstalk between the antennas and/or provide for improved radiation characteristics over antennas not having local isolation between each other.

Figure 3B:
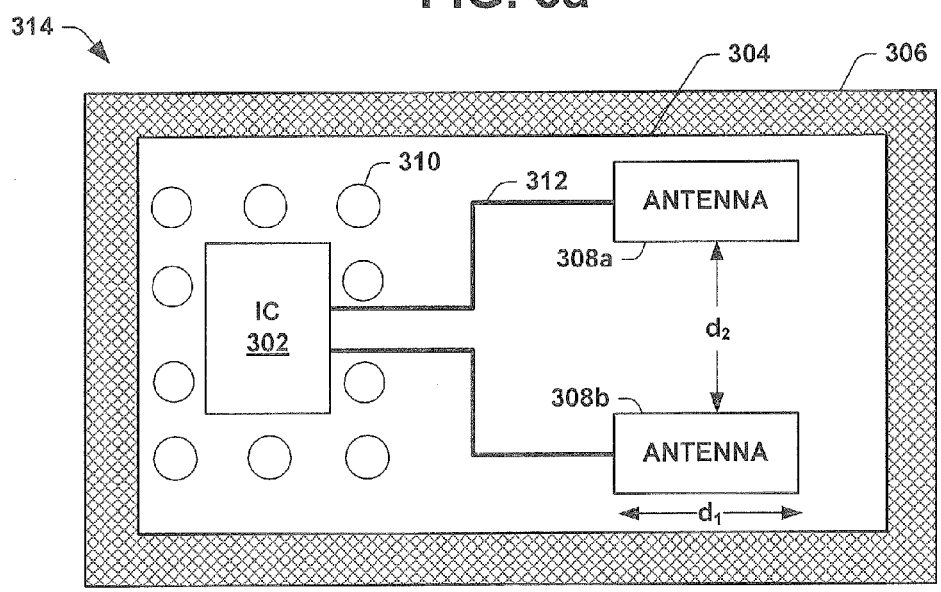

FIG. 3b illustrates an alternative embodiment, wherein a semiconductor module 314 has a package 304 comprising integrated antennas 308 that are separated by a spatial distance $d_2$ that is greater than the size $d_1$ of either antenna 308a or 308b (i.e., $d_2 > d_1$).

Figure 3C:
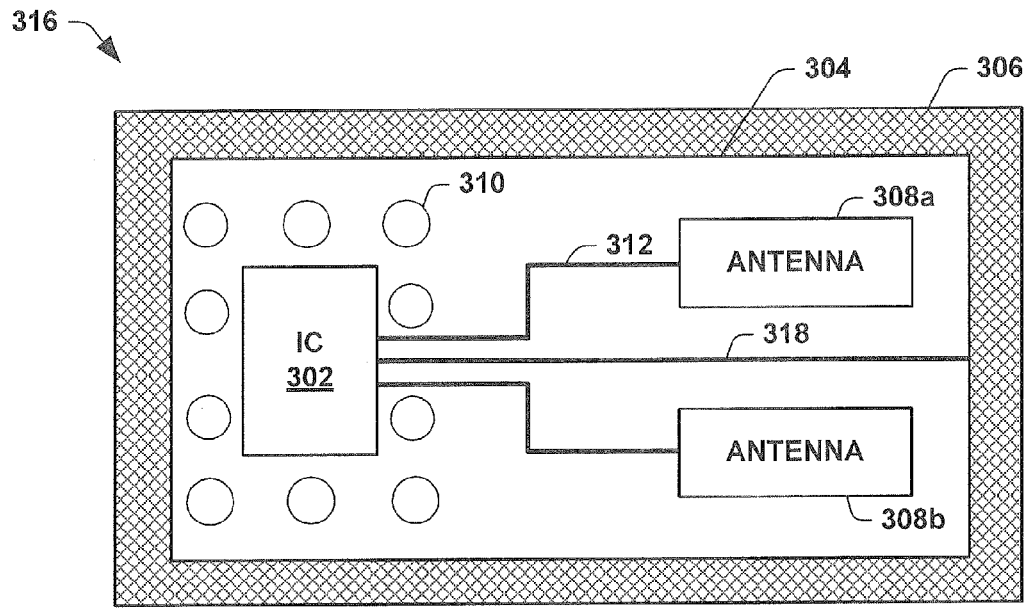

FIG. 3c illustrates an alternative embodiment, wherein a semiconductor module 316 has a package comprising two integrated antennas 308a and 308b that are electrically isolated from one another by way of an electrically isolating shield layer 318. In one embodiment, the electrically isolating shield layer 318 comprises a ground wire. In a further embodiment, the ground wire may comprise a redistribution layer of the package 304 that is connected to a ground terminal.

Figure 3D:
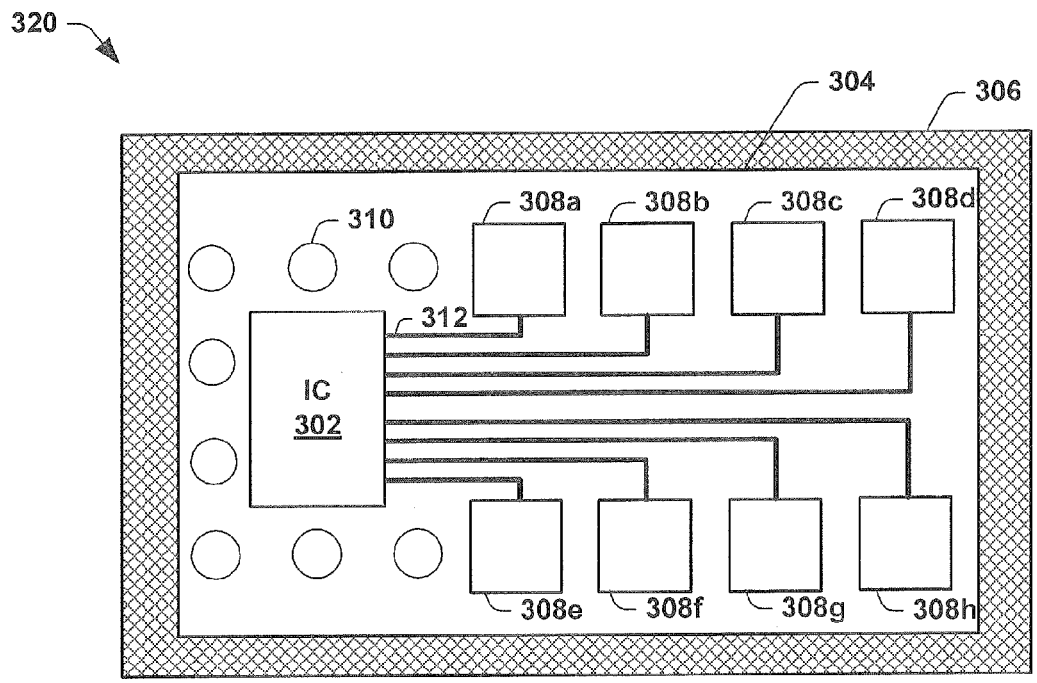

FIG. 3d illustrates an alternative embodiment, wherein a semiconductor module 320 has an array of antenna (e.g., comprising antennas 308a-308h). As shown in FIG. 3d, eight antennas 308a-308h are disposed within the package 304. In additional embodiments, more or less antennas may be comprised within the package 304 in various spatial configuration.

Figure 3E:
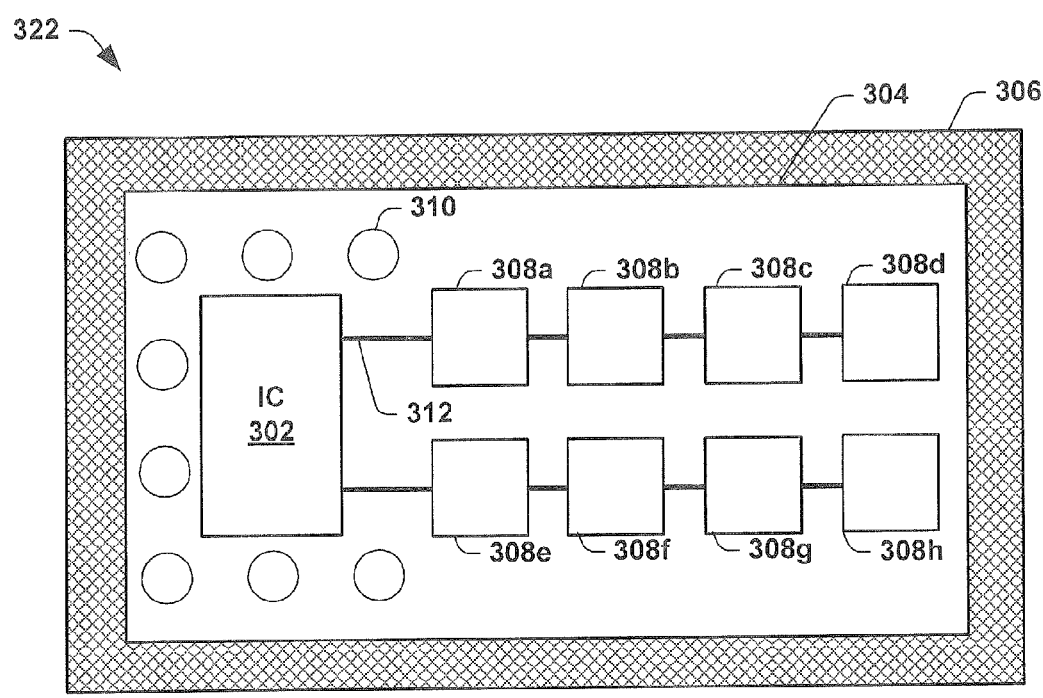

FIG. 3e illustrates an alternative embodiment of a semiconductor module 322 having an array of antennas. In FIG. 3e, antennas 308a-308h comprised within an antenna array are coupled together using a redistribution layer 312 of the package 304.

As shown in FIGS. 3a-3e, by confining the bonding interconnect structures 310 the size of a package 304 may increase, without increasing mechanical stress on the bonding structures 310, to accommodate a larger number of antennas (e.g., as shown in FIG. 3b) or large antennas (for low frequency antennas), for example.

Large package sizes may result in a package that may easily tip over (e.g., during soldering) if the center of gravity of the package lies outside of the connection area. In such embodiments, one or more support structures may be formed to prevent the package from tipping over. In one embodiment, the one or more support structures may be located around the periphery of the package to provide mechanical support of the package without forming an electrical connection between the package and the PCB. Since the support structures do not form an electrical connection between the package and the PCB, the support structures may be subjected to mechanical stress, due to temperature changes (e.g., reliability temperature cycling), without causing electrical connection problems between the package and the PCB.

Figure 4A:
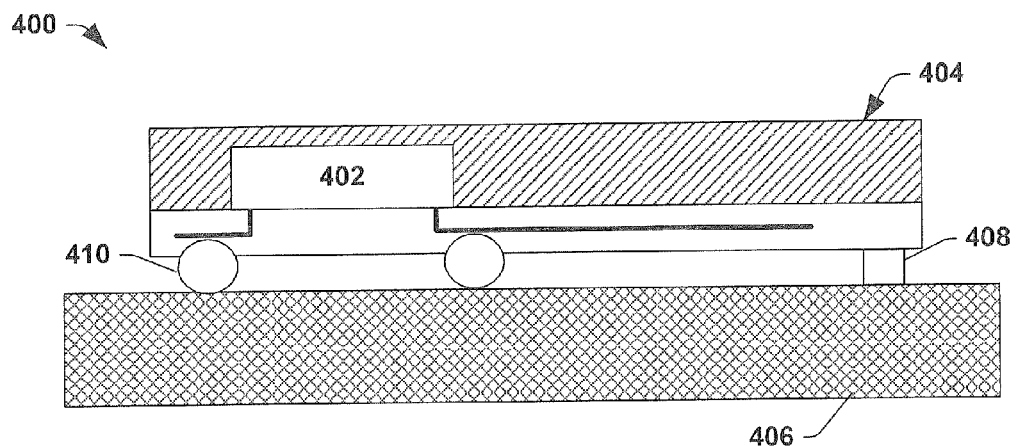
FIGS. 4a-4b illustrate two exemplary embodiments of a semiconductor module having one or more support structures coupled to the package to prevent the package from tipping over.
Figure 4B:
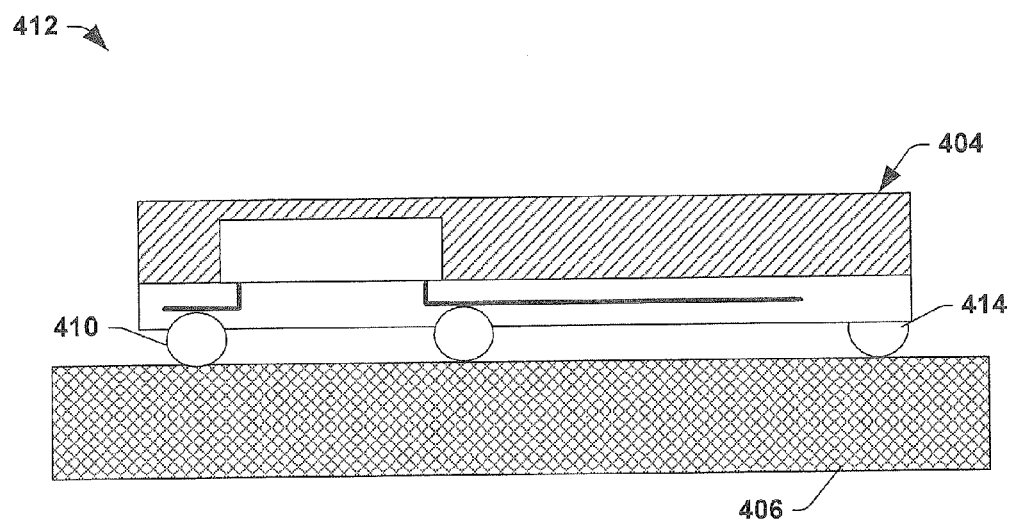

FIGS. 4a-4b illustrates two exemplary non-limiting embodiments of a semiconductor module having one or more support structures coupled to the package to prevent the package from tipping over.

As shown in FIG. 4a, the one or more support structures 408 are located at the periphery of the package and are configured to add mechanical support to the package 402 (e.g., keep the package at a constant distance from the PCB) without producing an electrical connection with the PCB 406. Since no electrical connection is formed between the package 404 and the PCB 406, the support structures 408 may be located away from the bonding interconnect structures 404 connections without causing electrical connection problems between the package and the PCB during thermal cycling. For example, when a temperature change occurs, package 404 may expand a larger distance than PCB 406 causing the top of the support structure to move right a larger distance than the bottom (coupled to the PCB). However, without having an electrical connection between the package 404 and the PCB 406, the mechanical stress is harmless.

In one embodiment, the one or more support structures 408 are configured to add mechanical support to the package 404 without producing a rigid mechanical connection with the PCB 406 (i.e., the support structure is not affixed to the PCB). Since no rigid mechanical connection is formed between the package 404 and the PCB 406, the support structures 408 may be located away from the bonding interconnect structures 410 connections without causing mechanical stress during thermal cycling.

It will be appreciated that the one or more support structures 408 may be formed by a wide range of applications since an accurate placement of the support structure is not critical. For example, printed support structures may be formed during fabrication of a package (e.g., before dicing). For example, in various non-limiting embodiments, the support structures 408 may be dispensed, jet-dispensed, or screen printed onto the package. The support structures 408 may also comprise a variety of conductive or non-conductive materials. In one embodiment, the support structure comprises a printed polymer formed as a part of the package. In alternative embodiments, the support structure may comprise epoxies, silicones, thermplastics, thermosets, or filled materials, for example.

In one particular embodiment, shown in FIG. 4b, the support structures may comprise one or more solder balls 412. In such an embodiment, a solder ball 412 may be formed on the package without an opposing metal pad on the PCB so that no electrical connection to the PCB is produced during a soldering step (e.g., in contrast to the bonding interconnect structures 410, the support solder ball 412 does not provide an electrical connection between the package 402 and the PCB 406). Therefore, mechanical stress on the support solder balls 412 is not harmful during thermal cycling of the semiconductor module. In one embodiment, the solder balls 412 may be configured at the cantilevered end of the package to keep the package 404 horizontal during soldering.

Although, FIGS. 2-4 have illustrated semiconductor modules comprising rectangular packages, it will be appreciated that a package containing one or more integrated antennas may also comprise a non-rectangular package. In one embodiment, support structures (e.g., corresponding to support structures of FIGS. 4a-4b) allow for the use of non-rectangular packages not having a center of gravity about the bonding structures/connection area.

In one embodiment, the package provided herein may be formed using wafer level packaging (WLP) process, wherein the integrated circuit is packaged at wafer level instead of the traditional process of assembling the package of each individual IC after wafer dicing. For example, in one embodiment a first polymer dielectric layer may be deposited onto a wafer to package the IC devices. A rewiring metal layer (e.g., Cu, Al, etc.) may then deposited over the dielectric layer and subsequently covered by another dielectric layer serving as the solder mask. An underbump metallization layer may then be deposited at locations to be subsequently occupied by the interconnect structures. After the interconnect structures have been attached, flip-chip techniques may be used to couple the package to the PCB.

Figure 5:
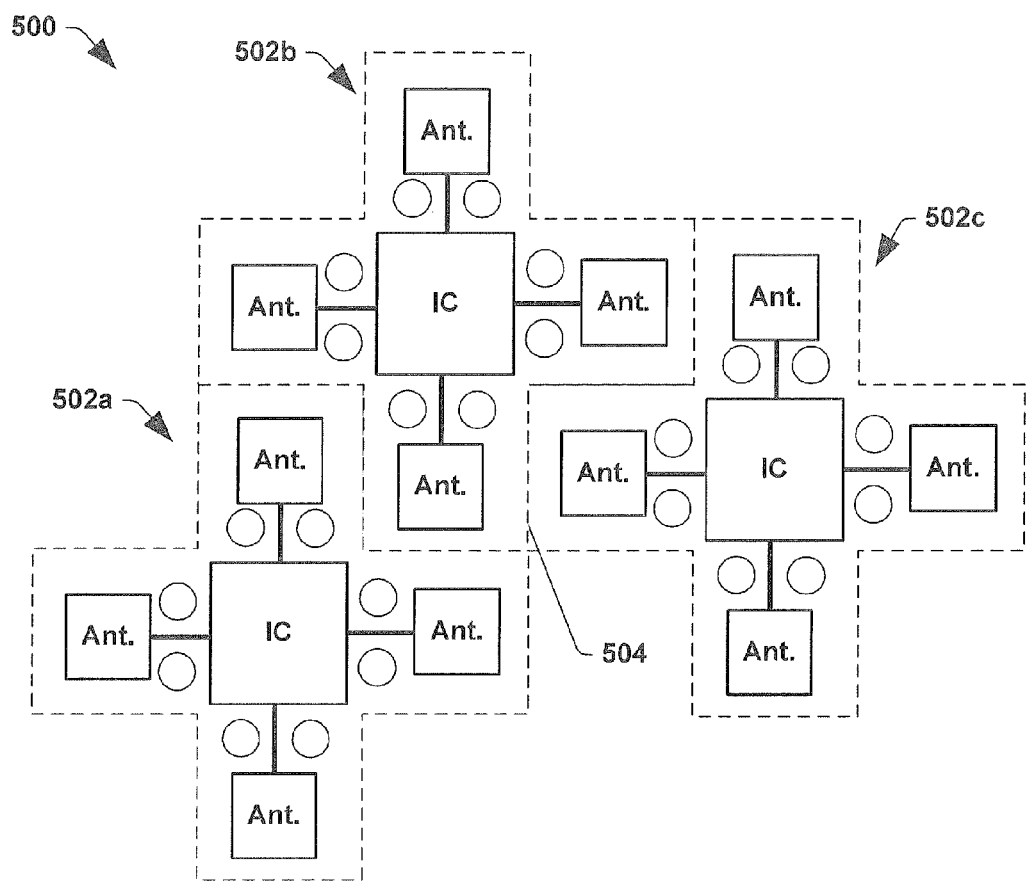
FIG. 5 illustrates a top view of packages with non-rectangular form containing one or more antennas.

In one embodiment, wherein a WLP packaging method is used, non-rectangular packages may be formed by laser dicing of the package. FIG. 5 illustrates one embodiment of packages 502 formed using laser dicing to have a non-rectangular form. As shown in FIG. 5, an integrated chip (IC) may be located within a non-rectangular package 502 comprising a plurality of antennas. The use of non-rectangular packages 502 allows for the space requirements for the packages having integrated antennas to be minimized. For example, as shown in FIG. 5, non-rectangular packages 502 may be formed adjacent to each other on a wafer, thereby allowing for unallocated parts of one package to be used for an adjacent package. A laser dicing tool may by used to separate the packages along scribe lines 504 resulting in a plurality of non-rectangular shaped packages.

Figure 6A:
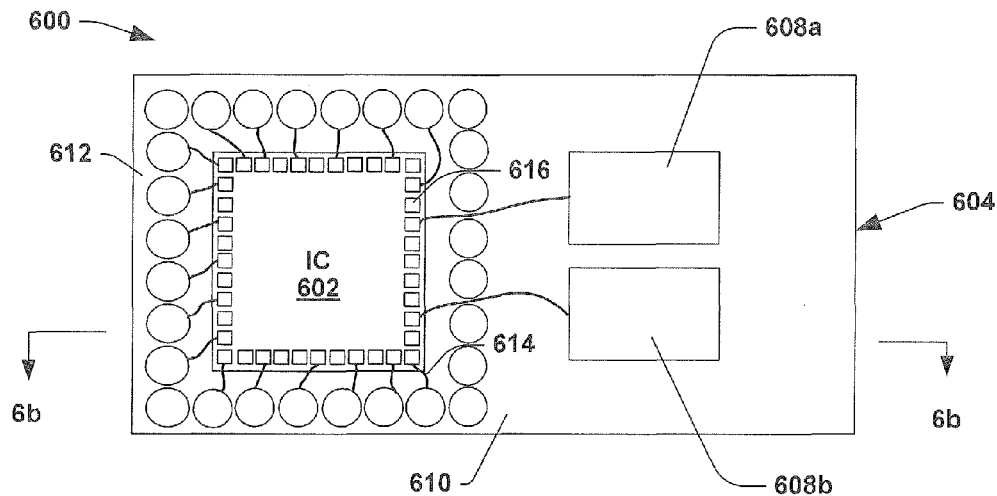
FIG. 6a illustrates a top view of a semiconductor module of one embodiment of the present disclosure.

FIG. 6a-6d illustrate more detailed embodiments of the semiconductor module provided herein. FIG. 6a illustrates a top view of a semiconductor module 600 with integrated antenna structures, according to an exemplary embodiment of the disclosure, and integrally packaged with an integrated circuit (IC) chip 602 for wireless communication. For example, the module 600 can comprise integrated antenna structures 608a and 608b embedded therein and integrated to the IC chip 602. Although two antenna structures 608a and 608b are illustrated herein, the disclosure is not limited to any specific number of antenna structures. The module 600 therefore comprises at least one integrated antenna structure for transmitting/receiving communication signals (e.g., millimeter wave output signals).

The semiconductor module 600 can comprise a wafer package 604, for example, an embedded wafer level ball grid array (eWLB) package 604 comprising the IC chip 602. The IC chip 602 can be any kind of integrated circuit chip such as any silicon chip that is embedded within the package 604. For example, the IC chip 602 may be a monolithic microwave integrated circuit (MMIC) chip for microwave engineering processes. MMIC devices typically perform functions such as microwave mixing, power amplification, low noise amplification, and high frequency switching. MMICs are dimensionally small (from around 1 mm$^2$ to 10 mm$^2$) and can be mass produced, which has allowed the proliferation of high frequency devices such as cellular phones. MMICs have fundamental advantages, namely transistor device speed and a semi-insulating substrate. Both factors can help with the design of high frequency circuit functions.

The wafer package 604 can comprise three dimensional (3D) bonding interconnect/interface structures 610, such as solder balls that may be surface-mountable in nature. The 3D bonding interconnect structures 610 can provide external contacts, mechanical support and/or spacing between the wafer package 604 and external contacts (e.g., package leads on a printed circuit board). For example, the 3D interconnect structures 610 can provide electrical connections between active components of the IC chip 602 or external components. The interconnect structures can comprise various bonding materials, such as bonding metals (e.g., Sn, Ag, and/or Cu).

As stated above, confinement of the bonding structures to a limited area of the package allows for a reduction in the thermal mismatch between the PCB and the package and therefore limits connection damage due to mechanical stress caused by thermal cycling. For example, as shown in FIG. 6a, placement of the bonding interconnect structure 610 in the vicinity of an IC device allows for at least part of an integrated antenna to extend radially outward from the IC device beyond the bonding interconnect structure.

The integrated antenna structure 608a and integrated antenna structure 608b may be used to transmit and/or receive wireless communication signals thereat to form a transceiver device. While the integrated antenna structure 608a and 608b are illustrated as two separate antenna structures, they may also be one antenna structure acting as a transceiver for transmission and/or reception thereat. Additionally, more than two antenna structures may be integrated into the package 604 and positioned in various angels for an optimized performance and minimizing mutual coupling.

The integrated antenna structure(s) can also comprise any one of a various types of planar antennas. For example, the antenna structures 608a and/or 608b may comprise dipole antennas, folded dipole antennas, ring antennas rectangular loop antennas, patch antennas, coplanar patch antennas, slot antennas, monopole antennas, etc., in addition to one or more of various types of antenna feed and/or impedance matching networks, such as balanced differential lines, coplanar lines, etc. in which one of ordinary skill in the art would appreciate.

In one embodiment, the integrated antenna structure 608a and/or 608b can be integrated into the package 604 with the chip 602 and package mold compound 612. For example, the integrated antenna 608a and/or 608b can be integrated into the same layer as the 3D interconnect structures 610 (e.g., solder balls) through an interface layer comprising redistribution or metallization layer (discussed infra). This can enable the antennas to be contacted to the silicon chip 602 within package 604 without a bonding interface structure that is external to bond pad connections 616 of the IC device. Because the package 604 comprises one common surface where the packaged mold compound 612 and chip 602 are combined in one wafer package 604, the interconnection between the antenna structures 608a, 608b and silicon chip 602 can be done in one wafer fabrication process flow. Thus, the cost of expensive high frequency substrates, often utilized for wave radar systems (e.g., millimeter waver radar systems, as for automotive safety and comfort applications) can be avoided. Additionally, impedance matching between antennas and chip output does not have to suffer from large tolerances of the bonding process and on printed circuit board wiring.

Figure 6B:
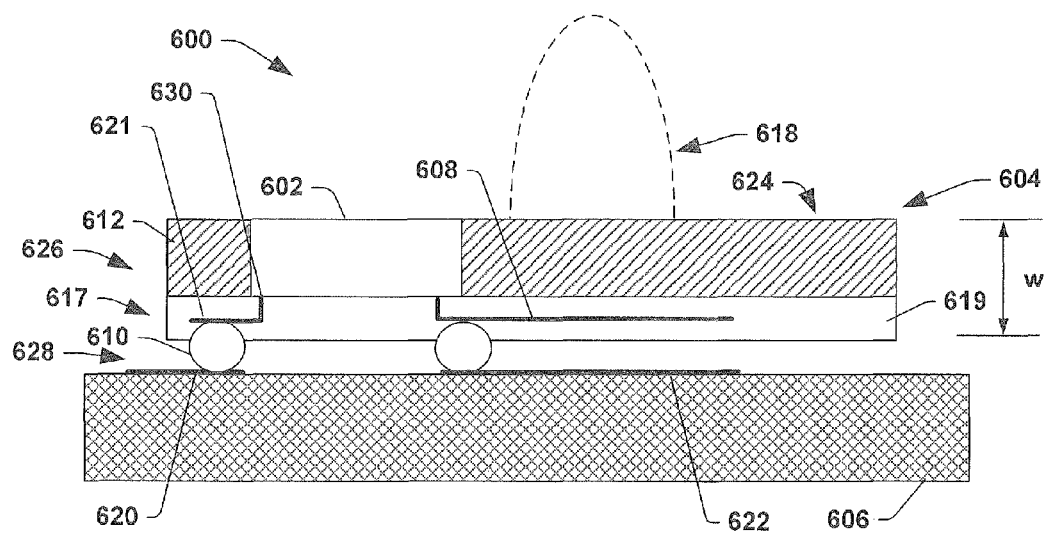
FIGS. 6b-6d illustrate various embodiments of a cross section of a semiconductor module in accordance with some aspects of the present disclosure.

Referring now to FIG. 6b, illustrates one embodiment of a cross-section of the semiconductor module 600 along the line 6b-6b. In the illustrative example of FIG. 6b, a printed circuit board substrate 606 is coupled to the package 604 via solder balls 610 and interconnects 620. The package 604 (as discussed above) can comprise a package molding compound layer 626 that comprises the package molding compound 612 and the IC chip 602, and an interface layer 617 comprising a redistribution layer 621 with integrated structures coupled thereto and a dielectric coat 619.

The package molding compound 612 can have very low losses and is a very good substrate for applications requiring small packages, such as in RF or wireless communication chips (e.g., for microwave radar sensing). The package molding compound 612 can comprise an organic polymer, such as an epoxy material that has an inorganic filling material (e.g., silicon dioxide). The package molding compound layer 626 can have the IC chip 602 embedded within the package molding compound 612, wherein a substantially planar surface 624 can be formed thereat and during wafer package processing.

The package 604 further comprises the interface layer 617 on a surface of the package molding compound layer 626 that comprises a metal layer/plane or the redistribution layer 621 in the dielectric coating 619 where the contents from the chip 602 to the package 604 are connected and integrated. The package 604 comprising the redistribution layer 621 and the package molding compound layer 626 can have a width w ranging from about 200 to 800 microns. A typical w value is about 450 microns The package 604 also comprises the 3D interconnect structures 610 (e.g., solder balls) that add further dimension to the package 604. The balls 610 are the interface from the IC chip 602 to the external world (e.g., outside the package molding compound layer 604), and can have a diameter from larger than 500 microns to about 200 microns or less. The distance between the balls can range from larger than 1 mm to 0.3 mm or less. A typical embodiment would have ball diameters of 300 microns and a pitch of 0.5 mm. The 3D bonding interconnect structures 610 can provide external contacts, mechanical support and/or spacing between the package 604 and external contacts 620 (e.g., package leads on a printed circuit board).

Figure 6C:
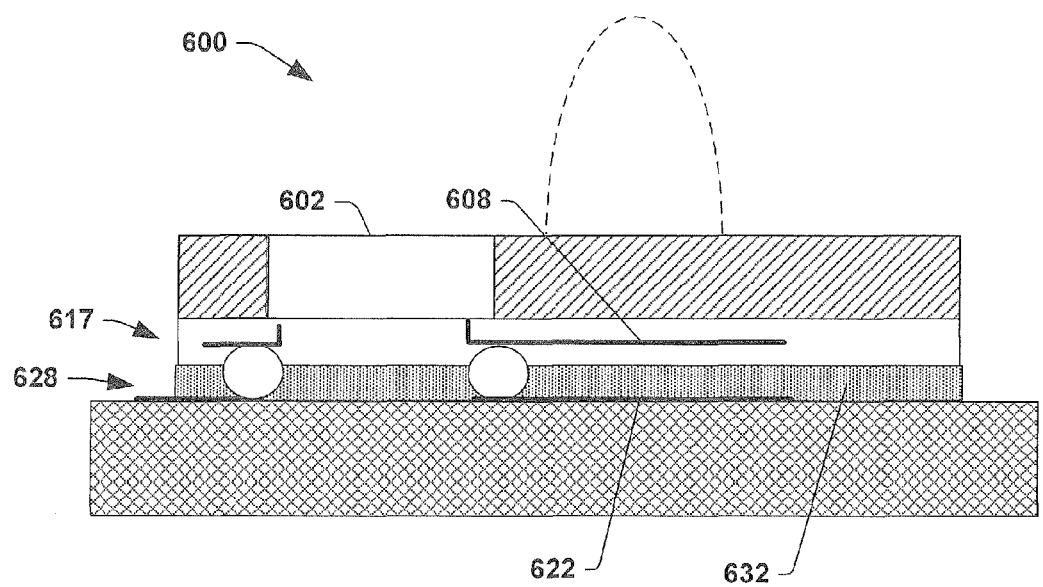

Between the package 604 and the printed circuit board 606 can be an air cavity 628. In one embodiment, the air cavity 628 can be filled with only air and/or a filler 632 (as illustrated in FIG. 6c), such as an under-fill comprising an epoxy compound (not shown). The printed circuit board (PCB) 606 can comprise a ground plane and/or reflector 622 positioned on the PCB 606 and within the air cavity 628. The reflector 622 can be opposite to and spaced from the integrated antenna structure 608a and/or 608b for providing a directive radiation 618 in a direction from the package 604 and/or from the PCB 606. Without the ground place/reflector 622, the radiation of energy from antenna structures could be in both directions, to the top and through the package mold compound as well as through the back of the package. With the reflector 622, a directive radiation 618 is directed substantially perpendicular to the PCB or the package to the outside world. In one embodiment, further reflector structures (not shown) or additional metal layers within the interface layer 617, such as metal bars (not shown) may be placed on one side of the antenna structure 608 for further directing a directive radiation 618 to a specific direction.

In one embodiment, the antenna structure 608 is integrated with the package molding compound layer 626 and to the IC chip 602 within the interface layer 617 through the redistribution layer 621 therein. For example, the antenna structure 608 can be formed to the same redistribution layer 614 as the bonding interface structure comprising the solder balls or 3D interconnect structures 610. The integrated antenna structure 608 can thus be coupled to the IC chip 602 from the redistribution layer 621 via a metallization layer 630 within. Because the antenna structure 608 is integrated directly into the package 604, no additional substrate specific to the antenna structure 608 is needed. The metallization layer 630 can also comprise metal interconnects (e.g., copper) for connecting the 3D bonding interconnect structures 610 and/or the integrated antenna structure 608 to bond pad connections 616 of the IC chip 602.

By integrating the antenna structures directly to IC chip 602 in the package molding compound layer 604, no additional high frequency substrates or lossy interfaces are incorporated for integrating antennas. Thus, cost structures for design can be reduced. Additionally, low loss interconnects between antennas and a semiconductor device can be achieved by means of such high precision wafer level processed modules as discussed above. Consequently, applications (e.g., automotive safety, blind spot detection and/or park aiding) can be finally implemented without high frequency connections on the circuit board.

Referring to FIG. 6c, illustrates one embodiment of a cross-section of the semiconductor module 600 along lines 6b-6b that is similar to FIG. 6b. The air cavity/gap 628 is located between interface layer 617 and the ground plane/reflector 622. In one embodiment, an additional material is introduced that is a fill or an underfill 632, such that there is substantially less air or no air in the air cavity 628. By doing this, the radiation properties of the antenna can be changed. For example, the fill can be used to reduce the thermal stress between the PCB board 606 and the IC chip 602 (e.g., a flip chip device). With the fill 632, reliability can be improved with respect to temperature cycling. The fill 632 can be a type of epoxy or organic material. The fill 632 comprises a different dielectric constant than air (about 1). As a consequence, the effective electrical distance between the integrated antenna structure 608 and reflector 622 can be improved. For example, the effective electrical distance can be about a quarter of a wavelength of the antenna radiation.

Figure 6D:
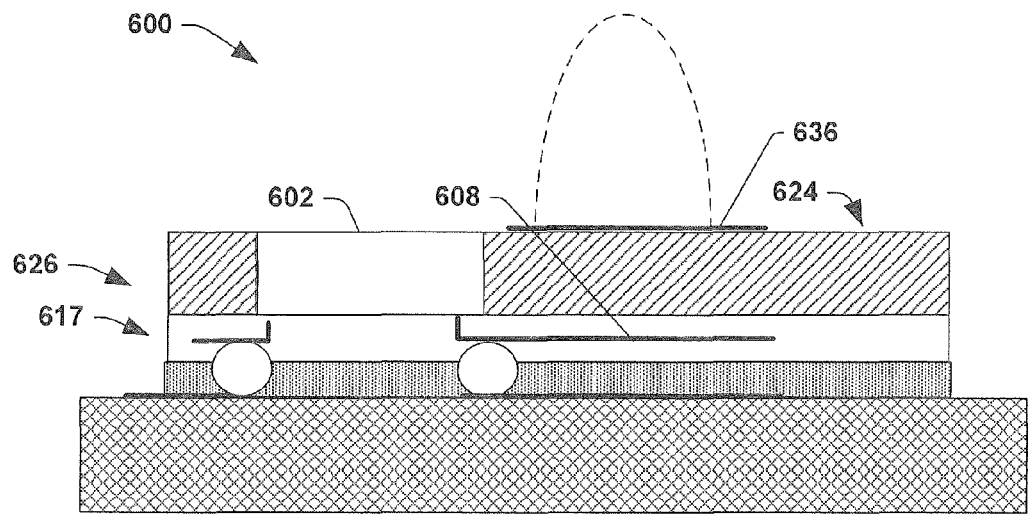

Referring now to FIG. 6d, illustrates another embodiment of a cross-section of the semiconductor module 600 along lines 6b-6b that is similar to FIG. 6b. FIG. 6d illustrates an embodiment of the module 600 further comprising an antenna structure 636 located on the surface 624 or backside of module 600 for modulating the field directivity of the directive radiation 618 of the integrated antenna structure 608. The antenna structure 636 can be any metal layer, for example, overlying the surface 624 or backside of module 600 and comprise any various geometry for supporting radiation on the front or opposing side of the module. In one embodiment, the antenna structure 600 can comprise at least one parasitic element for example, such as a parasitic antenna structure) located on the surface 624 of the package molding compound layer 626. Alternatively, the antenna structure 636 can comprise other structures and can be any desired geometry, such as a slot antenna, that may improve the radiation characteristics of the antenna.

The surface 624 can be substantially planar and opposing another surface of the package molding compound layer 626 coupled to the interface layer 617. The antenna structure 636 can be located, for example, opposite to the integrated antenna structure 608 and in a parallel configuration thereto. In other embodiments, the antenna structure may be located at other locations on the surface 624 than illustrated in FIG. 6d. For example, the antenna structure 636 may overlie silicon or the chip 602 partially or completely, and/or overlie the backside or surface 624 of module 600 partially or completely. Where the antenna structure overlies silicon or the chip 602, the antenna may be grounded as well, and can therefore be electrically connected to the integrated antenna structure 608.

The antenna structure 636 can be a radio antenna element, for example, which does not have any wired input, but instead absorbs radio waves radiated from another active antenna element (e.g., integrated antenna 608) in proximity. Then, the element 636 can re-radiate radio waves in phase with the active element so that it adds to the total transmitted signal. This can change the antenna pattern and beam width. The antenna structure 636 can also be used to alter the radiation parameters of a nearby active antenna. For example, the antenna structure 636 can be a parasitic microstrip patch antenna located above the integrated antenna structure 608, which may also be a patch antenna, for example, in one embodiment. This antenna combination resonates at a slightly lower frequency than the original element, and thus, can increase the impedance bandwidth of the integrated antenna structures embedded within the interface layer 617.

Figure 7:
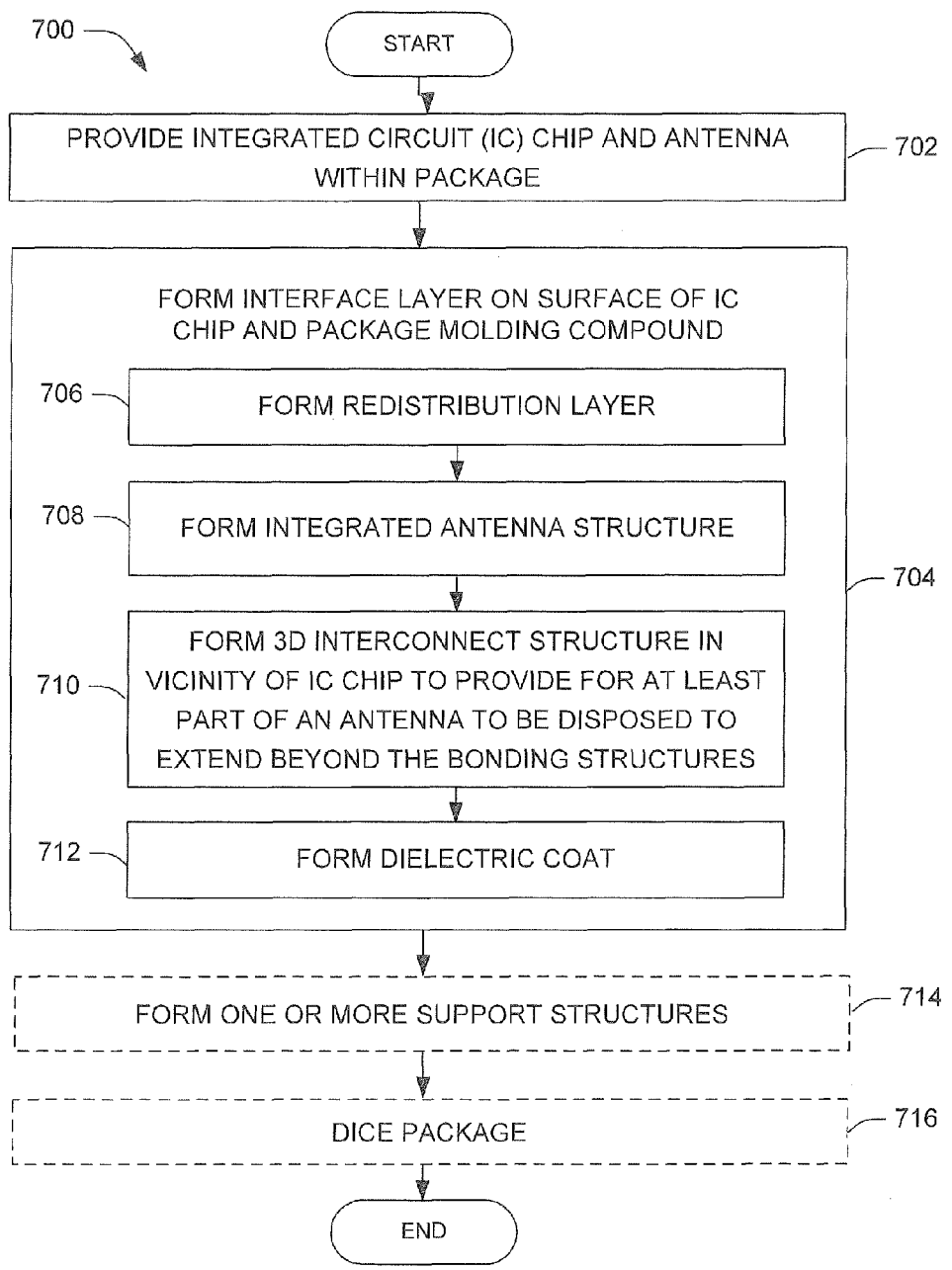
FIG. 7 is a flowchart illustrating an method of fabricating a semiconductor module.

FIG. 7 illustrates a flow diagram of an exemplary method 700 that may be used (e.g., operated by a control circuit) to form a semiconductor module comprising one or more integrated antenna structures extending outward from IC beyond a bonding interconnect structure having a plurality of individual bonding elements (i.e., having one or more integrated antennas configured at a greater center-to-center distance from the IC device than any individual bonding elements of the bonding interconnect structures)

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 702 an integrated circuit (IC) chip is provided and embedded within a package molding compound.

At 704 an interface layer is formed within the same package for integrating components therein to the chip within the molding compound. The interface layer is formed on the surface and coupled to the IC chip and the package molding compound. The method of forming the interface layer begins at 706 and comprises forming a redistribution layer. This layer can be a metallization layer formed from a metal plane, for example a copper plate therein. This layer provides the metallization interconnecting components of the interface layer to the IC chip. For example, at 708 at least one antenna structure is integrated to the IC chip within the package through the redistribution layer of the package.

Additionally, at 710 three dimensional (3D) interconnect structures (e.g. solder balls) are also formed and integrated with the IC chip through the redistribution layer within the vicinity of the IC chip to provide for at least part of an antenna to be disposed to extend beyond the bonding structures. Therefore, the semiconductor module comprises a bonding interface structure that is confined to a reduced portion of the package. In other words, the bonding interface structure may be confined to a connection area having an area that is significantly smaller (e.g., <30%) than the area of the bottom surface of a package. Such a bonding interface structure results in a package that is in contact with a PCB at a relatively small area (i.e., a connection area) and that supports the load of the package.

At 712 a dielectric or insulating coat can be formed.

At 714 one or more support structures are optionally formed. The one or more support structures may be located around the periphery of a package to provide mechanical support to the package without forming an electrical connection with the PCB. The support structure may be formed by a wide range of applications since an accurate placement of the support structure is not critical. For example, printed support structures may be formed during fabrication of a package. For example, in various non-limiting embodiments, the support structure may be dispensed, jet-dispensed, or screen printed onto the package. In one embodiment, the support structures may comprise one or more solder balls physically connected to the package and not forming an electrical connection between the package and a PCB.

At 716 the package is optionally diced. In one embodiment, dicing may comprise laser dicing, which allows for the formation of non-rectangular packages, thereby enabling an efficient use of the space requirements for the packages having one or more integrated antennas.

Although examples of techniques that are consistent with some implementations have been illustrated and described with respect to one or more implementations above, alterations and/or modifications may be made to the illustrated examples without departing from the spirit and scope of the appended claims. For example, although the packages described herein are illustrated as fan-out packages (i.e., packages having solder balls outside of the IC chip area) that that this is one non-limiting embodiment. In alternative embodiments, the packages may comprise fan in packages (i.e., packages having solder balls inside of the IC chip area).

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor module, comprising:
    a printed circuit board;
    a package comprising an integrated circuit embedded within a package molding compound and one or more integrated antenna structures coupled to the integrated circuit and configured to radiate electromagnetic radiation for wireless transmission or to receive electromagnetic radiation for wireless reception; and
    a bonding interconnect structure having one or more three dimensional interconnect structures vertically positioned between the package and the printed circuit board and configured to physically connect the package to the printed circuit board;
    wherein the at least one of the one or more integrated antenna structures is located at a greater center-to-center distance from IC device than the three dimensional interconnect structures.

2. The module of claim 1, wherein the three dimensional interconnect structures comprise surface-mountable solder balls.

3. The module of claim 1, wherein the bonding interconnect structure is configured to physically connect the package to the printed circuit board at a position that supports the package as a cantilevered structure that comprises at least part of the one or more integrated antenna structures.

4. The module of claim 1, further comprising one or more support structures physically coupled to the package and having no electrical connection between the printed circuit board and the package, wherein the support structures are located at greater center-to-center distance from the IC device than the three dimensional interconnect structures.

5. The module of claim 1, wherein outer edges of the bonding interconnect structure are positioned along a square having an area that is less than 40% of the total area of a bottom surface of the package.

6. The module of claim 1, wherein the one or more integrated antenna structures comprise a plurality of antenna structures respectively arranged on different sides of the IC device.

7. The module of claim 1, wherein the one or more integrated antenna structures comprise a plurality of antenna structures separated spatially by an electrically isolating shield layer.

8. The module of claim 1, wherein the package is formed using a wafer level packaging process and wherein the package comprises a non-rectangular shape that is formed by laser dicing.

9. The module of claim 1, wherein at least one of the one or more integrated antenna structures is located at a distance from a center of the integrated circuit having a horizontal component that is larger than a horizontal component of a distance from the center of the integrated circuit to the one or more three dimensional interconnect structures.

10. The module of claim 4, wherein the one or more support structures comprise one or more solder balls coupled to the package.

11. The module of claim 7, wherein the electrically isolating shield layer comprises a redistribution layer electrically connected to a ground terminal.

12. A semiconductor module, comprising:
a printed circuit board;
a package comprising an integrated circuit and one or more antenna structures laterally disposed from the integrated circuit within the package; and
a bonding interconnect structure comprising a plurality of interconnect structures configured to physically connect the package to the printed circuit board, wherein the plurality of interconnect structures are vertically positioned between the package and the printed circuit board, and wherein the plurality of interconnect structures define a connection area;
wherein the one or more antenna structures are laterally disposed from and do not vertically overlie the connection area.

* * * * *